(12) United States Patent
Zhou et al.

(10) Patent No.: US 12,294,345 B2
(45) Date of Patent: May 6, 2025

(54) STANDARD CIRCUIT AND STANDARD FOR FAR-END CROSSTALK OF CATEGORY 6A CABLE (CAT 6A)

(71) Applicant: National Institute of Metrology, China, Beijing (CN)

(72) Inventors: Xin Zhou, Beijing (CN); Qingfei Shen, Beijing (CN); Tong Wu, Beijing (CN)

(73) Assignee: National Institute of Metrology, China, Beijing (CN)

( * ) Notice: Subject to any disclaimer, the term of this patent is extended or adjusted under 35 U.S.C. 154(b) by 280 days.

(21) Appl. No.: 18/181,250

(22) Filed: Mar. 9, 2023

(65) Prior Publication Data
US 2023/0238935 A1    Jul. 27, 2023

(30) Foreign Application Priority Data
Sep. 29, 2022 (CN) .......................... 202211201259.3

(51) Int. Cl.
*H03H 7/01*      (2006.01)
(52) U.S. Cl.
CPC ................................ *H03H 7/0138* (2013.01)

(58) Field of Classification Search
CPC ...... H03H 7/0138; G01R 31/58; G01R 31/08; G01R 35/04; H04B 3/487
See application file for complete search history.

(56) References Cited

U.S. PATENT DOCUMENTS 6,162,077 A * 12/2000 Laes .................. H01R 13/6469
                                                            439/941
9,419,391 B2 * 8/2016 Bolouri-Saransar ... H01R 24/64

FOREIGN PATENT DOCUMENTS

| CN | 101197592 B | 9/2011 |
|---|---|---|
| CN | 101567864 B | 11/2012 |
| CN | 110531180 A | 12/2019 |

* cited by examiner

*Primary Examiner* — Andrea Lindgren Baltzell
*Assistant Examiner* — Kimberly E Glenn (57) ABSTRACT

A standard circuit for far-end crosstalk of a CAT 6A, including a first network connector and a second network connector. The first network connector includes a first transmitted signal pair and a first received signal pair. The second network connector is connected to the first network connector, and includes a second transmitted signal pair and a second received signal pair. The second transmitted signal pair is connected to the first transmitted signal pair. A first load is connected in series between the second received signal pair. A standard for far-end crosstalk of the CAT 6A is also provided.

9 Claims, 6 Drawing Sheets

STANDARD CIRCUIT AND STANDARD FOR FAR-END CROSSTALK OF CATEGORY 6A CABLE (CAT 6A)

CROSS-REFERENCE TO RELATED APPLICATIONS

This application claims the benefit of priority from Chinese Patent Application No. 202211201259.3, filed on Sep. 29, 2022. The content of the aforementioned application, including any intervening amendments thereto, is incorporated herein by reference in its entirety.

TECHNICAL FIELD

This application relates to cable analyzers, and more particularity to a standard circuit and a standard for far-end crosstalk of a category 6A cable (CAT 6A).

BACKGROUND

The cable analyzers are mainly used to measure the physical layer's parameters of local area network (LAN) and evaluate the quality of network cabling. Regarding the network cabling or network maintenance and failure elimination, the cable analyzer is applied to the certification of a cabling system to ensure that its connectivity and transmission performance satisfy the requirements of local, national or international standards. Considering that network failures are partially caused by the unsatisfactory cabling operation, the cable analyzer is in indispensable in the evaluation of cabling quality.

Regarding a standard circuit provided by JJF 1494-2014 "Calibration Specification for Network Cable Analyzers" for far-end crosstalk (shown as FIG. 1), it has been experimentally demonstrated to have obvious fluctuation in high frequency band (250 MHz-500 MHz). By analyzing the cabling of the printed circuit board (PCB), it is observed that all pairs are connected, which is easy to cause parasitic crosstalk between the pairs in the high frequency band. Moreover, the parasitic crosstalk is uncontrollable and obvious in the high frequency band. Therefore, this circuit design will weaken the reliability and controllability of the standard, thereby affecting the device performance.

SUMMARY

In order to overcome the above-mentioned deficiencies in the prior art, the present disclosure provides a standard circuit for far-end crosstalk of a category 6A cable (CAT 6A). Regarding the standard circuit, all paths irrelevant to the test of far-end crosstalk are disconnected, and a matched load is connected in series, so as to avoid the parasitic crosstalk, improving performance of the standard circuit. The present disclosure also provides a standard for far-end crosstalk of the CAT 6A.

In a first aspect, the present disclosure provides a standard circuit for far-end crosstalk of a CAT 6A, comprising:
a first network connector; and
a second network connector;
wherein the first network connector comprises a first transmitted signal pair and a first received signal pair; the second network connector is connected to the first network connector; the second network connector comprises a second transmitted signal pair and a second received signal pair; the first transmitted signal pair is connected to the second transmitted signal pair; and a first load is connected in series between the second received signal pair; and the first received signal pair is not directly connected to the second transmitted signal pair and the second received signal pair.

Regarding the standard circuit provided herein, all paths irrelevant to the test of far-end crosstalk are disconnected, and a matched load is connected in series, so as to avoid the parasitic crosstalk, improving performance of the standard circuit.

In some embodiments, the first network connector further comprises a first spare signal pair and a second spare signal pair; the second network connector further comprises a third spare signal pair and a fourth spare signal pair; a second load is connected in series between the third spare signal pair; and a third load is connected in series between the fourth spare signal pair.

In some embodiments, the first transmitted signal pair comprises a first transmitted positive signal pin and a first transmitted negative signal pin; the first received signal pair comprises a first received positive signal pin and a first received negative signal pin; the first spare signal pair comprises a first spare signal pin and a second spare signal pin; and the second spare signal pair comprises a third spare signal pin and a fourth spare signal pin; and a first capacitor is connected in series between the first transmitted positive signal pin and the first received positive signal pin; a second capacitor is connected in series between the first transmitted positive signal pin and the second spare signal pin; and a third capacitor is connected in series between the first transmitted positive signal pin and the third spare signal pin.

In some embodiments, the second transmitted signal pair comprises a second transmitted positive signal pin and the second transmitted negative signal pin; the second transmitted positive signal pin is connected to the first transmitted positive signal pin; the second transmitted negative signal pin is connected to the first transmitted negative signal pin; a fourth capacitor is connected in series between the second transmitted negative signal pin and the fourth spare signal pin; and a fifth capacitor is connected in series between the second transmitted negative signal pin and the first spare signal pin.

In some embodiments, the second received signal pair comprises a second received positive signal pin and a second received negative signal pin; the third spare signal pair comprises a fifth spare signal pin and a sixth spare signal pin; the fourth spare signal pair comprises a seventh spare signal pin and an eighth spare signal pin and a sixth capacitor is connected in series between the second transmitted negative signal pin and the second received negative signal pin;

a first end of the first load is connected to the second received positive signal pin;

and a second end of the first load is connected to the second received negative signal pin;

a first end of the second load is connected to the fifth spare signal pin; and a second end of the second load is connected to the sixth spare signal pin; and a first end of the third load is connected to the seventh spare signal pin; and a second end of the third load is connected to the eighth spare signal pin.

In some embodiments, the first load, the second load and the third load each comprise a resistor; and the resistor of the first load, the resistor of the second load and the resistor of the third load have the same resistance.

In some embodiments, the first network connector and the second network connector each comprise a registered jack 45 (RJ45).

In a second aspect, the present disclosure provides a standard for far-end crosstalk of a CAT 6A, comprising:
 a motherboard; and
 the above-mentioned standard circuit;
 wherein the standard circuit is fixedly arranged on the motherboard.

In some embodiments, the standard further comprises a first crossover cable and a second crossover cable, wherein the first crossover cable and the second crossover cable are connected to the standard circuit.

Regarding the standard provided herein, it includes the standard circuit, and all paths irrelevant to the test of far-end crosstalk are disconnected, and a matched load is connected in series, so as to avoid the parasitic crosstalk, improving performance of the standard.

BRIEF DESCRIPTION OF THE DRAWINGS

The above-mentioned and/or additional aspects and advantages of the present disclosure will become more apparent and understandable from the following description with reference to the embodiments and accompanying drawings.

DETAILED DESCRIPTION OF EMBODIMENTS

The present disclosure will be described in detail below with reference to the embodiments and accompanying drawings. The same or similar reference numerals indicate the identical or functionally similar elements. Obviously, provided below are merely some embodiments of the disclosure, and are not intended to limit the disclosure.

Figure 2:
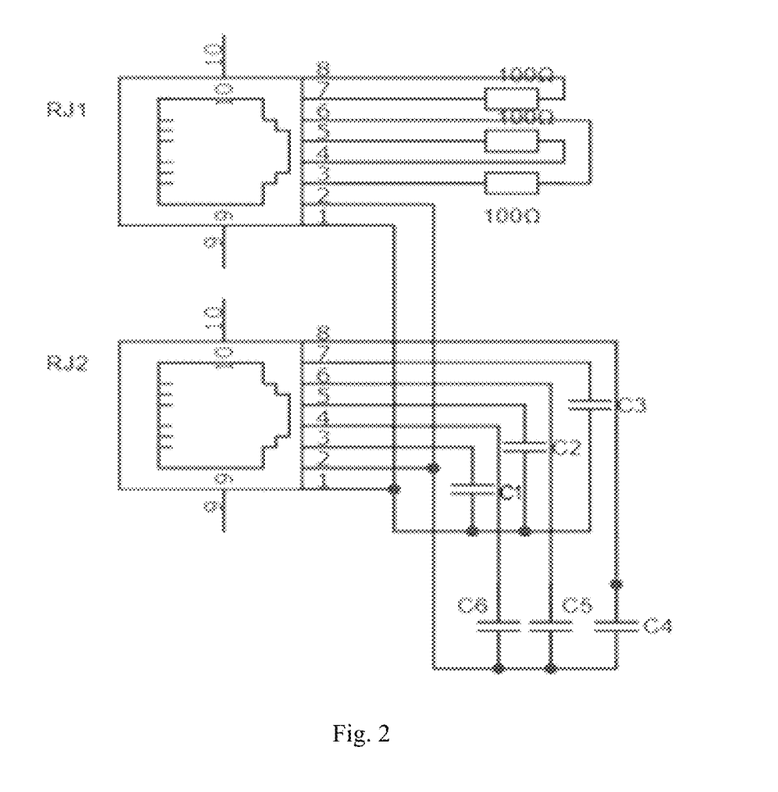
FIG. 2 shows a standard circuit for far-end crosstalk of a CAT 6A according to an embodiment of the present disclosure.

Provided in FIG. 2 is a standard circuit for far-end crosstalk of a CAT 6A, which can be applied to a standard.

The standard circuit is applied to a measurement circuit of the far-end crosstalk of a CAT 6A (augmented category 6 twisted-pair cable). The twisted-pair is the most commonly used transmission media in generic cabling projects, and is consisted of two copper wires with an insulating layer. The two insulated copper wires are twisted together according to a desired density to render a radio wave radiated by one wire being offset by a radio wave radiated by the other wire, so as to effectively reduce signal interference.

Referring to FIG. 2, the standard circuit provided herein includes a first network connector RJ2 and a second network connector RJ1. The first network connector RJ2 includes multiple signal pairs. In an embodiment, the first network connector RJ2 includes a first transmitted signal pair 12 and a first received signal pair 36. It should be understood that in some embodiments, the first network connector RJ2 can include other signal pairs in addition to the first transmitted signal pair 12 and the first received signal pair 36, such as a spare signal pair. Similarly, the second network connector RJ1 may also include multiple signal pairs.

Figure 1:
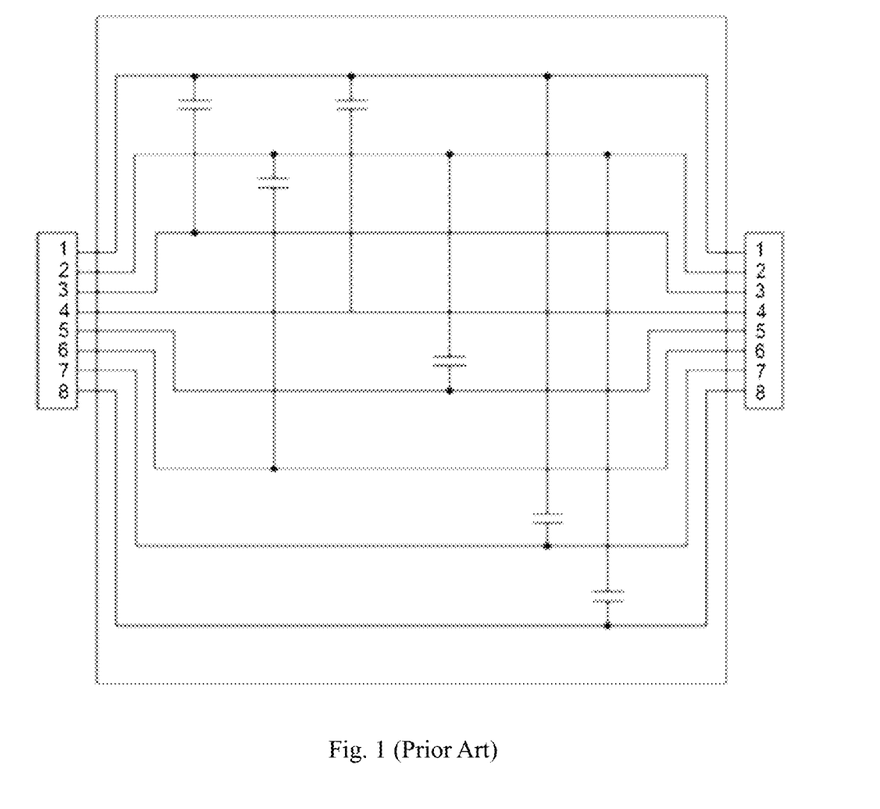
FIG. 1 shows a standard circuit in the prior art.

The second network connector RJ1 is connected to the first network connector RJ2. The second network connector RJ1 includes a second transmitted signal pair 12 and a second received signal pair 36. The second transmitted signal pair 12 of the second network connector RJ1 is connected to the first transmitted signal pair 12 of the first network connector RJ2. A first load is connected in series between the second received signal pair 36 of the second network connector RJ1. The signal pairs of the first network connector RJ2 except the first transmitted signal pair 12 are not directly connected to the signal pairs of the second network connector RJ1. Specifically, referring to FIG. 2, the first transmitted signal pair 12 is directly connected to the second transmitted signal pair 12. The signal pairs of the first network connector RJ2 except the first transmitted signal pair 12 are not directly connected to the signal pairs of the second network connector RJ1. Usually, the signal pairs of the first network connector RJ2 except the first transmitted signal pair 12 are connected to the second network connector RJ1 through a positive signal pin 9 and a negative signal pin 10. It should be noted that the positive signal pin can be numbered as 10, and the negative signal pin can be numbered as 9. Referring to FIG. 2, only the first transmitted signal pair 12 of the first network connector RJ2 is directly connected to the second transmitted signal pair 12 of the second network connector RJ1; and the first received signal pair 36 of the first network connector RJ2 is not directly connected to any signal pair of the second network connector RJ1. It is different from the standard circuit in the prior art. Regarding the standard circuit in prior art, as shown in FIG. 1, a transmitted signal pair 12 of a left-side network connector is directly connected to a transmitted signal pair 12 of a right-side network connector. A received signal pair 36 of the left-side network connector is directly connected to a received signal pair 36 of the right-side network connector. A spare signal pair 45 at the left side is directly connected to a spare signal pair at the right side. A spare signal pair 78 at the left side is directly connected to a spare signal pair 78 at the right side.

Regarding the standard circuit provided herein, only the first transmitted signal pair 12 of the first network connector RJ2 is directly connected to the second transmitted signal pair 12 of the second network connector RJ1, and all paths irrelevant to the test of far-end crosstalk are disconnected, and a matched load is connected in series between the second transmitted signal pair 12 of the second network connector RJ1, so as to avoid the parasitic crosstalk, improving the performance of the standard circuit.

In an embodiment, referring to FIG. 2, the first network connector RJ2 further includes a first spare signal pair 45 and a second spare signal pair 78. The second network connector RJ1 further includes a third spare signal pair 45 and a fourth spare signal pair 78. A second load is connected in series between the third spare signal pair 45. A third load is connected in series between the fourth spare signal pair 78. By means of the second load and the third load, the parasitic crosstalk can be avoided, further improving performance of the standard circuit.

In an embodiment, referring to FIG. 2, the first transmitted signal pair 12 of the first network connector RJ2 includes a first transmitted positive signal pin 1 and a first transmitted negative signal pin 2. The first received signal pair 36 includes a first received positive signal pin 3 and a first received negative signal pin 6. The first spare signal pair 45 includes a first spare signal pin 4 and a second spare signal pin 5. The second spare signal pair 78 includes a third spare signal pin 7 and a fourth spare signal pin 8.

Regarding the first network connector RJ2, a first capacitor C1 is connected in series between the first transmitted positive signal pin 1 and the first received positive signal pin 3. A second capacitor C2 is connected in series between the first transmitted positive signal pin 1 and the second spare signal pin 5. A third capacitor C3 is connected in series between the first transmitted positive signal pin 1 and the third spare signal pin 7. A fourth capacitor C4 is connected in series between a second transmitted negative signal pin 2 and the fourth spare signal pin 8. A fifth capacitor C5 is connected in series between the second transmitted negative signal pin 2 and a second received negative signal pin 6. A sixth capacitor C6 is connected in series between the second transmitted negative signal pin 2 and the first spare signal pin 4. By means of the capacitors C1-C6, a far-end crosstalk value between pairs is controlled. By optimizing the capacitance value, the parasitic capacitance and inductance caused by wires on a PCB can be offset, thereby making a smooth frequency response curve of far-end crosstalk, further ensuring a stable and reliable calibration result.

The capacitance of the six capacitors C1-C6 can be set equal or not exactly equal. In an embodiment, the capacitance of the six capacitors C1-C6 is equal to 0.1 µF. In another embodiment, the capacitance of the six capacitors C1-C6 can be adjusted according to requirements to make them being slightly different. In view of a reality that a geometric position and cabling of different line pairs on the board cannot be identical, the parasitic capacitance of different line pairs will not be the same. By adjusting the capacitance of the six capacitors C1-C6, the parasitic capacitance can be compensated, such that crosstalk values of the line pairs can be as close as possible.

In an embodiment, referring to FIG. 2, the second transmitted signal pair 12 of the second network connector RJ1 includes a second transmitted positive signal pin 1 and the second transmitted negative signal pin 2. The second transmitted positive signal pin 1 is connected to the first transmitted positive signal pin 1. The second transmitted negative signal pin 2 is connected to the first transmitted negative signal pin 2. Consequently, the transmitted signal pins of the first network connector RJ2 are directly connected to the transmitted signal pins of the second network connector RJ1.

In an embodiment, referring to FIG. 2, the second received signal pair 36 of the second network connector RJ1 includes a second received positive signal pin 3 and the second received negative signal pin 6. The third spare signal pair 45 includes a fifth spare signal pin 4 and a sixth spare signal pin 5. The fourth spare signal pair 78 includes a seventh spare signal pin 7 and an eighth spare signal pin 8. The first load is connected to the second received positive signal pin 3 and the second received negative signal pin 6, that is, a first end of the first load is connected to the second received positive signal pin 3, and a second end of the first load is connected to the second received negative signal pin 6. The second load is connected to the fifth spare signal pin 4 and the sixth spare signal pin 5, that is, a first end of the second load is connected to the fifth spare signal pin 4, and a second end of the second load is connected to the sixth spare signal pin 5. The third load is connected to the seventh spare signal pin 7 and the eighth spare signal pin 8, that is, a first end of the third load is connected to the seventh spare signal pin 7, and a second end of the third load is connected to the eighth spare signal pin 8. Regarding the standard circuit provide herein, the first load is provided between the second received signal pair 36, the second load is provided between the third spare signal pair 45, and the third load is provided between the fourth spare signal pair 78, thereby avoiding the parasitic crosstalk and improving the performance of the standard circuit.

Regarding the standard circuit provided herein, the first transmitted signal pair 12 of the first network connector RJ2 is directly connected to the second transmitted signal pair 12 of the second network connector RJ1, and the signal pairs of the first network connector RJ2 except the first transmitted signal pair 12 are not directly connected to the signal pairs of the second network connector RJ1, such that a far-end crosstalk of the first transmitted signal pair 12 of the first network connector RJ2 can be tested.

It should be understood that the standard circuit provided herein can also test far-end crosstalk of other signal pairs of the first network connector RJ2. When far-end crosstalk of the first received signal pair 36 of the first network connector RJ2 is required to be tested, the first received signal pair 36 of the first network connector RJ2 is directly connected to the second received signal pair 36 of the second network connector RJ1, and the signal pairs of the first network connector RJ2 except the first received signal pair 36 (such as the first transmitted signal pair 12, the first spare signal pair 45 and the second spare signal pair 78) are not directly connected to the signal pairs of the second network connector RJ1. Similarity, the signal pairs of the first network connector RJ2 except the first received signal pair 36 are indirectly connected to the second network connector RJ1 through the positive signal pin 9 and the negative signal pin 10.

Specifically, when the far-end crosstalk of a signal pair of the first network connector RJ2 is tested, the capacitance of the six capacitors C1-C6 can be adjusted to compensate the parasitic capacitance, such that crosstalk values of the line pairs can be as close as possible. According to international electrotechnical commission (IEC) 61935, a calibration of the cable analyzer should be performed near the limiting value. In order to fully test the cable analyzer, the standard for far-end crosstalk was implemented both above and below the limiting value by adjusting the capacitance in the standard circuit, as shown in Table 1.

TABLE 1

| Capacitors in the standard for far-end crosstalk | | | | | | |
|---|---|---|---|---|---|---|
| Standard | | C1(pF) | C2(pF) | C3(pF) | C4(pF) | C5(pF) | C6(pF) |
| Above the limit | 12 | 1.0 | 1.2 | 1.5 | 1.0 | 1.5 | 1.2 |
|  | 36 | 1.5 | 2.5 | 1.5 | 1.5 | 2.5 | 1.5 |
|  | 45 | 1.2 | 2.5 | 1.2 | 1.2 | 2.5 | 1.2 |
|  | 78 | 1.2 | 1.5 | 1.0 | 1.5 | 1.2 | 1.0 |
| Below the limit | 12 | 3.0 | 4.7 | 4.7 | 4.7 | 4.7 | 3.0 |
|  | 36 | 4.7 | 4.7 | 4.7 | 4.7 | 4.7 | 4.7 |
|  | 45 | 4.7 | 6.8 | 4.7 | 4.7 | 6.8 | 4.7 |
|  | 78 | 3.3 | 4.7 | 4.7 | 4.7 | 4.7 | 3.3 |

In Table 1, the "above (below) the limit" in the first column corresponds to the six capacitors C1-C6 in the standard above (below) the limit. The second column represents a standard corresponding to a certain pair with respect to other pairs. For example, "12" represents that a standard corresponding to the pair 12 with respect to other pairs (a standard module corresponds to all standard values of a pair to other pairs). C1-C6 indicate the first capacitor to the sixth capacitor. The capacitance will be slightly different, because the geometric positions of ports and cabling of different line pairs on the board cannot be identical, and the parasitic capacitance of different line pairs will not be exactly same. The C1-C6 are adjusted to compensate the parasitic capacitance to render crosstalk values of the line pairs to be as close as possible.

When testing the far-end crosstalk of the first received signal pair 36 of the first network connector RJ2, the first received signal pair 36 is directly connected to the second received signal pair 36 of the second network connector RJ1. The first capacitor C1 is connected in series between the first transmitted positive signal pin 1 and the first received positive signal pin 3. The second capacitor C2 is connected in series between the first received positive signal pin 3 and the second spare signal pin 5. The third capacitor C3 is connected in series between the first received positive signal pin 3 and the third spare signal pin 7. The fourth capacitor C4 is connected in series between the first received negative signal pin 6 and the second transmitted negative signal pin 2. The fifth capacitor C5 is connected in series between the first received negative signal pin 6 and the first spare signal pin 4. The sixth capacitor C6 is connected in series between the first received negative signal pin 6 and the fourth spare signal pin 8. Similarly, when testing the far-end crosstalk of the first spare signal pair 45 of the first network connector RJ2 or the second spare signal pair 78 of the first network connector RJ2, the first spare signal pair 45 or the spare signal pair 78 is directly connected to the corresponding signal pair of the second network connector RJ1, and the rest signal pairs irrelevant to the far-end crosstalk test are disconnected, leading to an individual and accurate far-end crosstalk test for each signal pair.

The first load, the second load and the third load are resistor, capacitor or inductor, etc. In an embodiment, the first load, the second load and the third load are resistors whose resistances can be the same or not exactly the same. In this embodiment, the resistances of the first load, the second load and the third load are the same (100Ω) to achieve impedance matching.

In an embodiment, the first network connector and the second network connector are a RJ45. The RJ45 is a kind of information jack connector in a cabling system. The connector consists of a plug (linker and registered jack) and a socket (module). The plug includes eight grooves and eight contact points. For example, eight contact points of the first network connector RJ2 are the first transmitted signal pair 12, the first received signal pair 36, the first spare signal pair 45 and the second spare signal pair 78. The connector consisted of the plug and the socket is connected between wires, so as to achieve electrical continuity of the wires.

Provided herein is a standard for far-end crosstalk of the CAT 6A, including a motherboard and the above-mentioned standard circuit. the standard circuit is fixedly arranged on the motherboard.

Regarding the standard provided herein, the standard circuit is integrated on the motherboard, and the line pairs of the standard circuit are fixedly arranged on the motherboard, so as to make the standard configured for calibration of far-end crosstalk.

Figure 3:
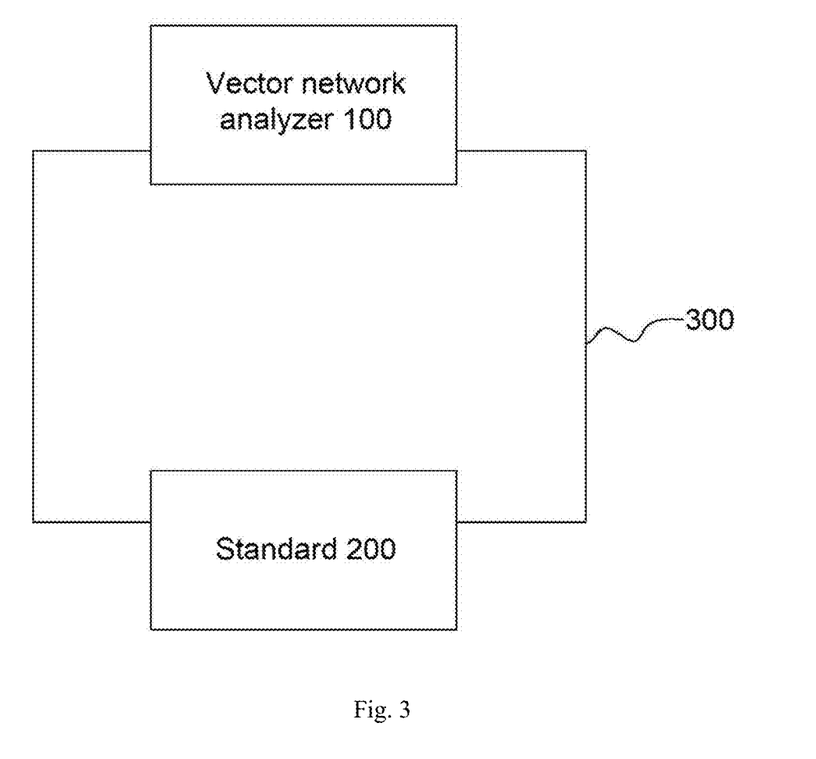
FIG. 3 structurally depicts a calibration system for far-end crosstalk of a CAT 6A according to an embodiment of the present disclosure.

Referring to FIG. 3, a calibration system for far-end crosstalk of the CAT 6A is provided, including a vector network analyzer 100, the above-mentioned standard 200 and a wire 300.

The vector network analyzer 100 is connected to the standard 200 through multiple wires 300. Specifically, one end of the wires is connected to the vector network analyzer 100, and the other end of the wires is connected to the standard 200.

Regarding a network cable analyzer, the far-end crosstalk is represented by an attenuation to crosstalk ratio (ACR-F). The ACR-F is defined as a difference between a path loss from a main chain to a slave chain and a path loss of the main chain, that is, $ACR-F=IL_{M2S}-IL_{M2M}$, where M2S represents a local end of the main chain to a remote end of the slave chain; and M2M represents the local end of the main chain to a remote end of the main chain. By defining the ACR-F as the difference between the two path losses, the far-end crosstalk can be calibrated, that is, the far-end crosstalk is calibrated by measuring the two path losses.

Figure 4:
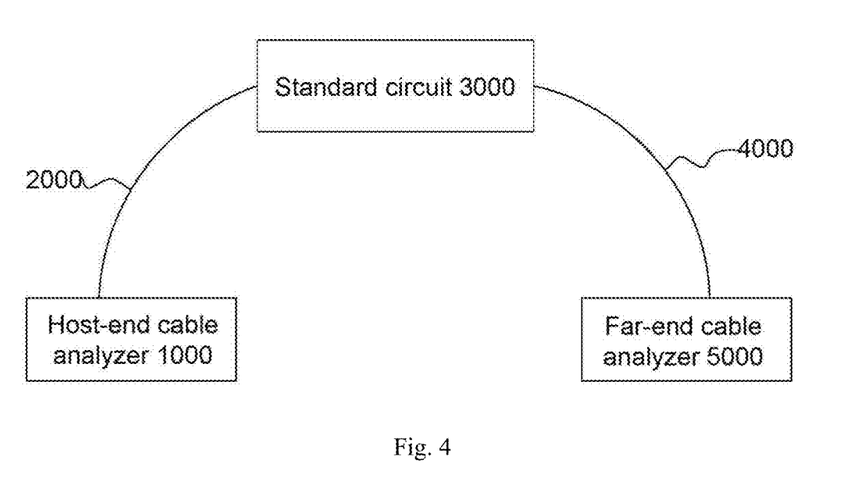
FIG. 4 schematically depicts a calibration system for far-end crosstalk of a CAT 6A according to another embodiment of the present disclosure.
Figure 5:
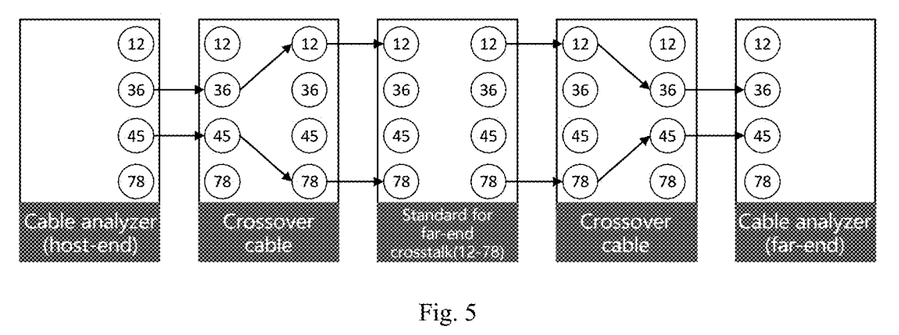
FIG. 5 is a specific schematic diagram of the calibration system shown in FIG. 4.
Figure 6:
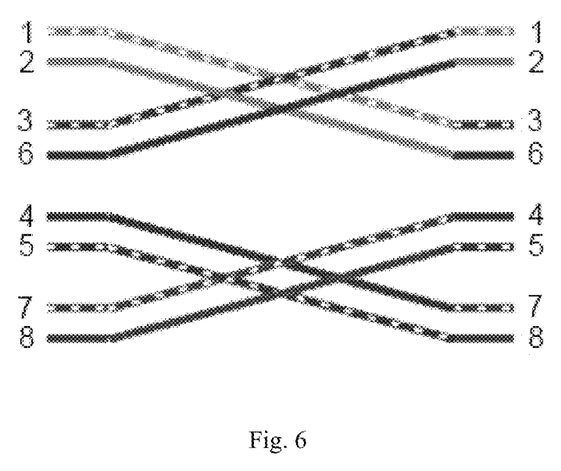
FIG. 6 schematically depicts connection of crossover cables of the calibration system shown in FIG. 5.

Referring to FIGS. 4-6, another calibration system for far-end crosstalk of the CAT 6A is provided, including a host-end cable analyzer 1000, a first crossover cable 2000, a standard circuit 3000, a second crossover cable 4000 and a far-end cable analyzer 5000.

Referring to FIGS. 4 and 5, the host-end cable analyzer 1000 includes a third received signal pair 36 and a fifth spare signal pair 45. The first crossover cable 2000 includes a fourth received signal pair 36, a sixth spare signal pair 45, a third transmitted signal pair 12 and a seventh spare signal pair 78. The fourth received signal pair 36 of the first crossover cable 2000 is connected to the third received signal pair 36 of the host-end cable analyzer 1000. The sixth spare signal pair 45 of the first crossover cable 2000 is connected to the fifth spare signal pair 45 of the host-end cable analyzer 1000.

The standard circuit 3000 is the above-mentioned circuit, including the first transmitted signal pair 12, the second spare signal pair 78, the second transmitted signal pair 12 and the fourth spare signal pair 78. The first transmitted signal pair 12 of the standard circuit 3000 is connected to the third transmitted signal pair 12 of the first crossover cable 2000. The second spare signal pair 78 of the standard circuit 3000 is connected to the seventh spare signal pair 78 of the first crossover cable 2000.

The second crossover cable 4000 includes a fourth transmitted signal pair 12, an eighth spare signal pair 78, a fifth received signal pair 36 and a ninth spare signal pair 45. The fourth transmitted signal pair 12 of the second crossover cable 4000 is connected to the second transmitted signal pair 12 of the standard circuit 3000. The eighth spare signal pair 78 of the second crossover cable 4000 is connected to the fourth spare signal pair 78 of the standard circuit 3000.

The far-end cable analyzer 5000 includes a sixth received signal pair 36 and a tenth spare signal pair 45. The sixth received signal pair 36 of the far-end cable analyzer 5000 is connected to the fifth received signal pair 36 of the second crossover cable 4000. The tenth spare signal pair 45 of the far-end cable analyzer 5000 is connected to the ninth spare signal pair 45 of the second crossover cable 4000.

As used herein, terms "an embodiment", "some embodiments", "example", "specific example" and "some examples" mean that the specific features, structures, materials, or characteristics described with reference to the embodiment or example are included in at least one embodiment or example of the present application. The above terms do not have to be directed to the same embodiment or example. Moreover, the specific features, structures, materials, or characteristics described may be combined in a suitable manner in any one or more embodiments or examples.

Described above are merely illustrative of the disclosure, and are not intended to limit the disclosure. Although the disclosure has been illustrated and described in detail above, it should be understood that those skilled in the art could still make modifications and changes to the embodiments of the disclosure. Those modifications, changes, replacements and variations made by those skilled in the art based on the content disclosed herein without sparing creative effort shall fall within the scope of the present disclosure defined by the appended claims.

What is claimed is:

1. A standard circuit for far-end crosstalk of a category 6A cable (CAT 6A), comprising:
   a first network connector; and
   a second network connector;
   wherein the first network connector comprises a first transmitted signal pair and a first received signal pair; the second network connector is connected to the first network connector; the second network connector comprises a second transmitted signal pair and a second received signal pair; the first transmitted signal pair is connected to the second transmitted signal pair; and a first load is connected in series between the second received signal pair; and
   the first received signal pair is not directly connected to the second transmitted signal pair and the second received signal pair.

2. The standard circuit of claim 1, wherein the first network connector further comprises a first spare signal pair and a second spare signal pair; the second network connector further comprises a third spare signal pair and a fourth spare signal pair; a second load is connected in series between the third spare signal pair; and a third load is connected in series between the fourth spare signal pair.

3. The standard circuit of claim 2, wherein the first transmitted signal pair comprises a first transmitted positive signal pin and a first transmitted negative signal pin; the first received signal pair comprises a first received positive signal pin and a first received negative signal pin; the first spare signal pair comprises a first spare signal pin and a second spare signal pin; and the second spare signal pair comprises a third spare signal pin and a fourth spare signal pin; and
   a first capacitor is connected in series between the first transmitted positive signal pin and the first received positive signal pin; a second capacitor is connected in series between the first transmitted positive signal pin and the second spare signal pin;
   and a third capacitor is connected in series between the first transmitted positive signal pin and the third spare signal pin.

4. The standard circuit of claim 3, wherein the second transmitted signal pair comprises a second transmitted positive signal pin and a second transmitted negative signal pin; the second transmitted positive signal pin is connected to the first transmitted positive signal pin; the second transmitted negative signal pin is connected to the first transmitted negative signal pin; a fourth capacitor is connected in series between the second transmitted negative signal pin and the fourth spare signal pin; and a fifth capacitor is connected in series between the second transmitted negative signal pin and the first spare signal pin.

5. The standard circuit of claim 4, wherein the second received signal pair comprises a second received positive signal pin and a second received negative signal pin; the third spare signal pair comprises a fifth spare signal pin and a sixth spare signal pin; the fourth spare signal pair comprises a seventh spare signal pin and an eighth spare signal pin and a sixth capacitor is connected in series between the second transmitted negative signal pin and the second received negative signal pin;
   a first end of the first load is connected to the second received positive signal pin;
   and a second end of the first load is connected to the second received negative signal pin;
   a first end of the second load is connected to the fifth spare signal pin; and a second end of the second load is connected to the sixth spare signal pin; and
   a first end of the third load is connected to the seventh spare signal pin; and a second end of the third load is connected to the eighth spare signal pin.

6. The standard circuit of claim 2, wherein the first load, the second load and the third load each comprise a resistor; and the resistor of the first load, the resistor of the second load and the resistor of the third load have the same resistance.

7. The standard circuit of claim 1, wherein the first network connector and the second network connector each comprise a registered jack 45 (RJ45).

8. A standard for far-end crosstalk of a CAT 6A, comprising:
   a motherboard; and
   the standard circuit of claim 1;
   wherein the standard circuit is fixedly arranged on the motherboard.

9. The standard of claim 8, further comprising:
   a first crossover cable; and
   a second crossover cable;
   wherein the first crossover cable and the second crossover cable are both connected to the standard circuit.

* * * * *